(12) United States Patent
Frauenknecht et al.

(10) Patent No.: US 6,444,028 B2
(45) Date of Patent: Sep. 3, 2002

(54) CHARGING MATERIAL AND HOLDING SYSTEM FOR THE CHARGING MATERIAL

(75) Inventors: Axel Frauenknecht, Burghausen; Matthäus Schantz, Reut; Viktor Beer, Simbach, all of (DE)

(73) Assignee: Wacker-Chemie GmbH, München (DE)

( * ) Notice: Subject to any disclaimer, the term of this patent is extended or adjusted under 35 U.S.C. 154(b) by 0 days.

(21) Appl. No.: 09/851,229

(22) Filed: May 8, 2001

(30) Foreign Application Priority Data

May 25, 2000 (DE) .......................... 100 25 863

(51) Int. Cl.[7] .............................................. C30B 35/00
(52) U.S. Cl. ........................ 117/218; 117/208; 117/911; 423/328.2
(58) Field of Search ................. 117/208, 218, 117/911; 423/328.2

(56) References Cited

U.S. PATENT DOCUMENTS

| | | | |
|---|---|---|---|
| 5,888,293 A | | 3/1999 | Fujiyama et al. ............. 117/13 |
| 5,948,164 A | * | 9/1999 | Iida et al. ................... 117/218 |
| 6,183,556 B1 | * | 2/2001 | Aydelott et al. ............ 117/218 |
| 6,197,108 B1 | * | 3/2001 | Iino et al. ...................... 117/13 |

FOREIGN PATENT DOCUMENTS

| | | |
|---|---|---|
| CH | 576 281 | 6/1976 |
| DE | 3922135 | 12/1991 |

OTHER PUBLICATIONS

H Hadamovsky, Werkstoffe der Halbleitertechnik, Chapter 6, VEB—Verlag, Leipzig, 1985.

W. Zulehner and D. Huber, Czochralski—Grown Silicon, Crystals 8, Springer Verlag, 1982.

English Derwent Abstract AN 1991–023024 Corresponding to DE 3922135.

Patent Abstract of Japan Corresponding to JP 60–077191.

English Derwent Abstract AN 1972–79777T Corresponding to CH 576 281.

* cited by examiner

*Primary Examiner*—Felisa Hiteshew
(74) *Attorney, Agent, or Firm*—Collard & Roe, P.C.

(57) ABSTRACT

A charging material made from semiconductor material, is used for charging or recharging a melting crucible during the Czochralski crucible-pulling process. This charging material has a polycrystalline semiconductor rod, which at one end has a groove, and a monocrystalline semiconductor rod, which at one end has a tongue, which rods are coupled by means of a tongue-and-groove connection. There is also a holding system for holding a polycrystalline silicon rod during the Czochralski crucible-pulling process or the float zone process, which has a tongue-and-groove connection between the polycrystalline semiconductor rod, which at one end has a groove, and a monocrystalline semiconductor rod, which at one end has a tongue.

4 Claims, 3 Drawing Sheets

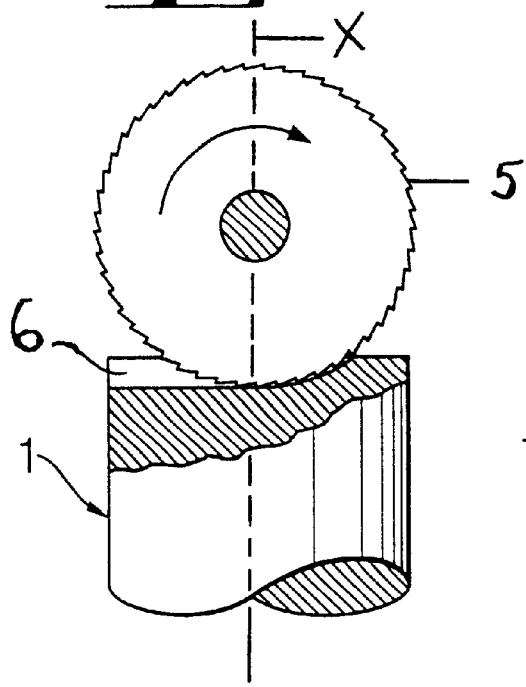
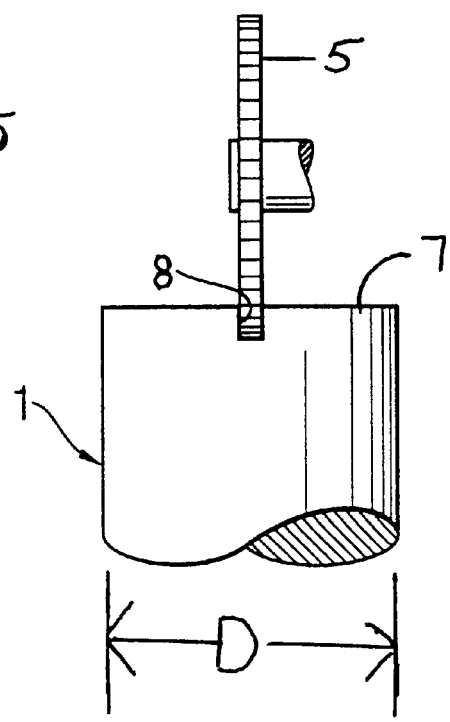
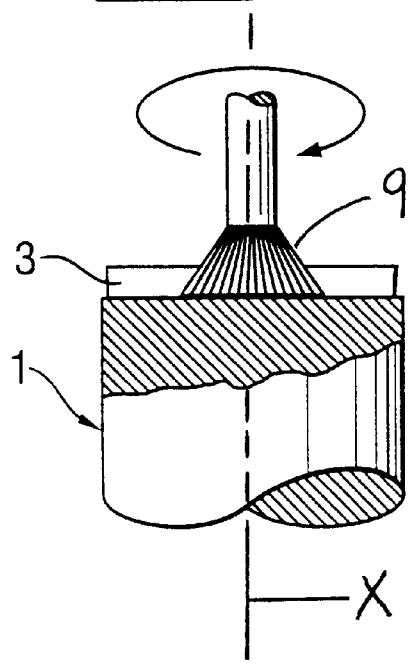
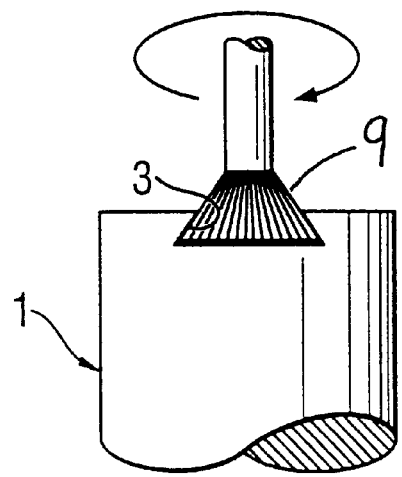

CHARGING MATERIAL AND HOLDING SYSTEM FOR THE CHARGING MATERIAL

BACKGROUND OF THE INVENTION

1. Field of the Invention

The present invention relates to a charging material made from semiconductor material, for charging or recharging a melting crucible during the Czochralski crucible-pulling process. The invention also relates to a holding system for the charging material. The invention furthermore relates to a holding system between two semiconductor rods.

2. The Prior Art

During the production of single crystals using the Czochralski crucible-pulling process, silicon fragments or silicon granules are introduced into a crucible and are melted. Since the specific bulk density of the fragments or granules is lower than the theoretical specific density of silicon, the filling level of the crucible falls during the melting. In order, however, to obtain a high yield, polycrystalline silicon granules or polycrystalline silicon rods are added to the molten silicon an are also melted.

The Czochralski crucible-pulling process is extensively explained in, for example, W. Zulehner and D. Huber, *Czochralski-Grown Silicon, Crystals 8, Springer Verlag, Berlin-Heidelberg,* 1982, and the literature cited therein, taking particular account of what is currently the most important application area, namely the crucible pulling of silicon single crystals. In many cases, there has been a move toward improving the filling level of the crucible by adding further solid melting material in the form of semiconductor rods. These rods are added after the initial melting, to the melt which has been formed from the lumpy material which was initially charged. To do this, polycrystalline pieces of rod are dipped, as charging material or recharging material, into the exposed surface of the melt. This is done by means of suitable holders or holding systems, generally before the actual pulling operation commences. These pieces are gradually melted until the desired melt level is reached.

During production of single crystals using the float zone process, polycrystalline silicon rods are melted on a zonal basis by means of a high-frequency coil (H. Hadamovsky, *Werkstoffe der Hableitertechnik, Chapter 6, VEB-Verlag, Leipzig,* 1985).

A common feature of both processes is that-the polycrystalline silicon rods have to be held on rotating shafts in the pulling installations.

U.S. Pat. No. 5,888,293 has disclosed a recharging material and a holding system for the recharging material. The recharging material comprises a multiplicity of polycrystalline silicon rods which are linked by means of connecting pieces. The holding system comprises an encircling flute which is arranged on the outside of the lateral surface of the polycrystalline silicon rod and a gripper system made from various materials, such as for example from quartz, tantalum, or molybdenum. The drawback of this holding system is that the high-purity molten silicon is contaminated by the materials used in the gripper system.

The drawback of the charging material is that it is not possible to charge the semiconductor material and pull a single crystal from the melt in a single step. This is because first of all the charging material has to be melted and only then can a seed crystal be brought,to the surface of the melt. However, it is desirable for the charging and pulling of a single crystal to be carried out in a single step. To do this, charging material and monocrystalline seed crystal have to be connected to one another. Accordingly, with this technique it is not possible subsequently to use a monocrystalline rod holder as a seed.

Various methods of holding polycrystalline rods in pulling installations have been disclosed in the prior art. By way of example, holding systems which provide connection by means of a weld between a monocrystalline holding rod and the polycrystalline silicon rod are known from DE 39 22 135. This connecting technique is highly complex. The polycrystalline. silicon rod must first be provided with a flute and a cone. Then, the polycrystalline silicon rod is fitted at the flute, for example in a float zone pulling installation. Then, at the other end, i.e. at the cone, the monocrystalline rod holder is welded to the polycrystalline silicon rod. Only then is it possible to use a holding arrangement of this type. The partially fused monocrystalline rod holder can only be reused after extensive re-machining.

SUMMARY OF THE INVENTION

Therefore an object of the present invention is to provide a holding system, in particular for charging material, which is distinguished by a high strength and which can be produced without complex thermal treatment of the semiconductor rods and without using other materials.

Another object of the invention is to provide a charging material which avoids the drawbacks of the prior art and is suitable for charging and pulling a single crystal from the melt.

The above objects are achieved by a charging material made from semiconductor material, for charging or recharging a melting crucible during the Czochralski crucible-pulling process, which has a polycrystalline semiconductor rod, which at one end is designed as a groove, and a monocrystalline semiconductor rod, which at one end is designed as a tongue, which rods are coupled by means of a tongue-and-groove connection.

Surprisingly, it has been found that it is possible to produce a tongue-and-groove connection between hard, brittle materials, such as for example a polycrystalline semiconductor rod and a monocrystalline semiconductor rod, preferably a highs strength monocrystalline seed crystal. Another surprise was that this connection is able to withstand bending stresses which are caused by suspending the monocrystalline semiconductor rod in a non-coaxial manner with respect to the rod axis, although the seed crystal is small and at risk of breaking compared to the semiconductor rod.

According to the invention, complex process steps, such as fusion of the seed, the use of foreign materials in the holder or the holding system and therefore contamination of the product are avoided by the holding system. Furthermore, fitting the rods into the pulling installations is simplified and it is possible for the polycrystalline semiconductor rods and the monocrystalline semiconductor rods, in particular the monocrystalline seed crystal, to be transported separately from one another. Fundamentally, the holding system can be reused and the connection point is of high strength.

Accordingly, the invention also relates to a holding system which makes it possible to secure polycrystalline silicon rods in all float zone and crucible-pulling processes without complex heat treatment of the connection point and without foreign materials at the connection point. The holding system according to the invention has a tongue-and-groove connection between a pollycrystalline semiconductor rod, which at one end is designed as a groove, and a monocrystalline semiconductor rod, for example a seed crystal, which at one end is designed as a tongue.

The holding system is preferably used to hold pollycrystalline silicon rods which are added to the molten silicon during the Czochralski crucible-pulling process. The holding system is preferably used to hold polycrystalline silicon rods which are melted on a zonal basis during the float zone process.

The holding system is a releasable mechanical connection between a polycrystalline semiconductor rod, in particular a silicon rod, and a monocrystalline semiconductor rod, in particular a silicon rod, preferably a monocrystalline silicon seed crystal, which can be obtained without using additional tools or materials.

The holding system is distinguished by complete reusability, if appropriate after the holding rod made from monocrystalline silicon has been cleaned, in processes in which the monocrystalline semiconductor rod is not used as a seed crystal.

Another advantage of the holding system according to the invention is a separately transportable holder made from hyperpure silicon, in particular from monocrystalline hyperpure silicon, which only has to be fitted when the polycrystalline semiconductor rod is being introduced into float zone or crucible-pulling apparatus.

A further advantage is that production of the groove can be readily automated; allowing a multiplicity of polysilicon rods to be machined in a single machining step.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawing, wherein similar reference characters denote similar elements throughout the several views:

FIG. 2A shows front view and FIG. 2B shows a side view of a saw blade for cutting a stress-relief channel into the polysilicon rod;

FIG. 2C shows a front view and FIG. 2D shows a side view of using a beveled milling head to produce the groove in the polysilicon rod.

DETAILED DESCRIPTION OF PREFERRED EMBODIMENTS

Figure 3A:
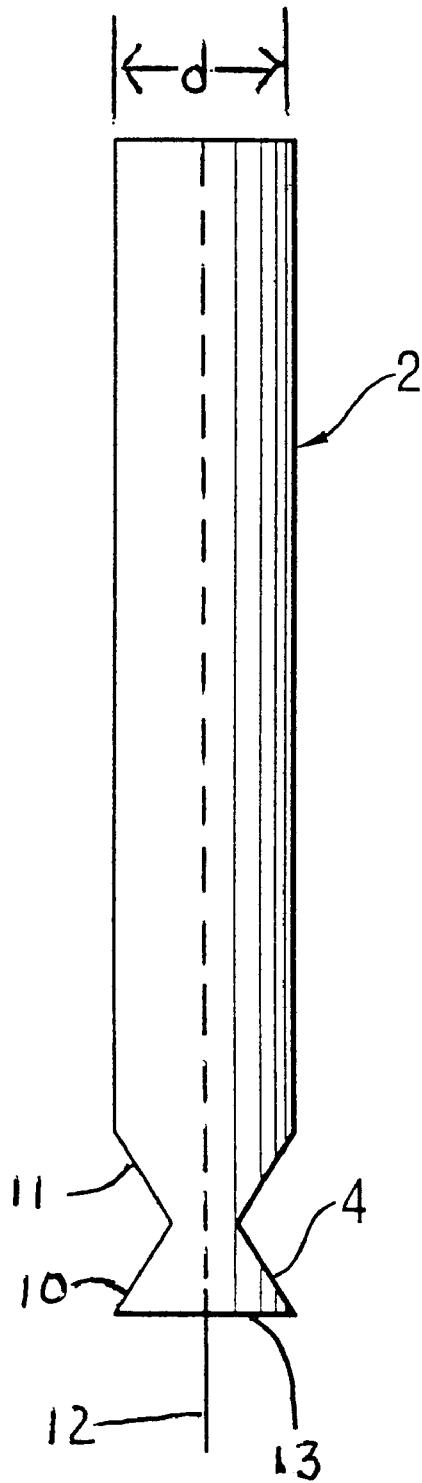
FIG. 3A shows a front view and FIG. 3B shows a side view of the monocrystalline seed crystal being provided with two angle-milled formations on the diameter at an end side.
Figure 3B:
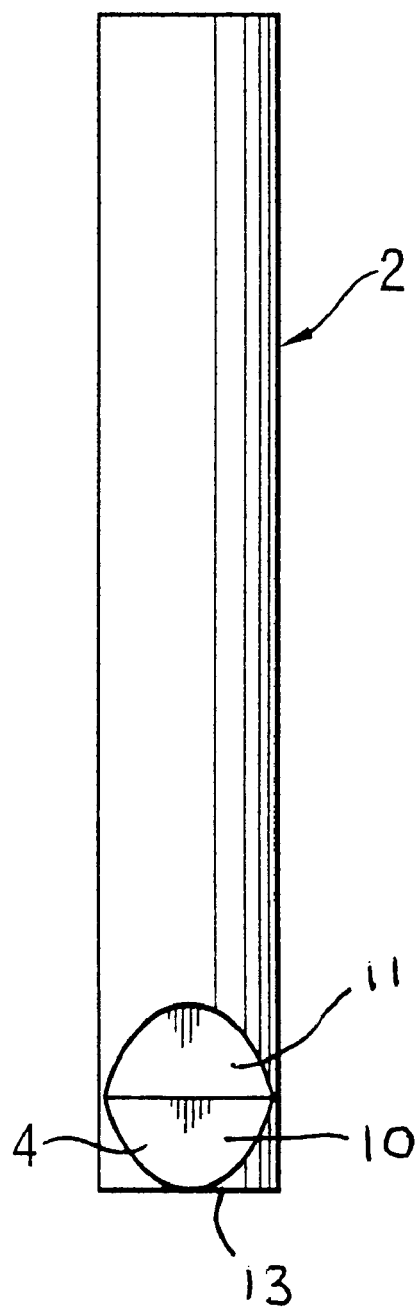

Turning now in detail to the drawings, the production of the tongue-and-groove connection will now be described.
1. Dovetail Groove A saw blade 5 is used to cut a channel 6 into the polysilicon rod 1, which has been cut to length, perpendicular to its end side 7, in the center 8, over the entire diameter D of the rod. This channel is for stress-relief of the polysilicon rod. The intention is to prevent an inhomogeneous stress distribution in the polysilicon rod during the production of the dovetail groove itself. An inhomogeneous stress distribution of this type would cause the polysilicon rod to fracture (FIGS. 2A and 2B). After this stress-relief step, the groove 3 is produced using a beveled milling head 9 (FIGS. 2C and 2D). A further advantage of making a prior incision using the saw blade 5 is the significantly higher feed rate of the milling head 9, since less material has to be removed. The two tools, namely the saw blade and milling head, can machine the rod in immediate succession.
2. Dovetail Tongue A monocrystalline seed crystal 2 is provided with two angle-milled formations 10 and 11 on the diameter d at an end side 13 (FIGS. 3A and 3B). Tongue 10 is trapezoidal in shape. Crystal 2 has center axis 12. The conical shoulder 4 (FIG. 1) is formed by the lower tongue 10 and the upper slanted portion 11.
3. Holding System According to the Invention (Combination of Tongue-and-groove)

Figure 1:
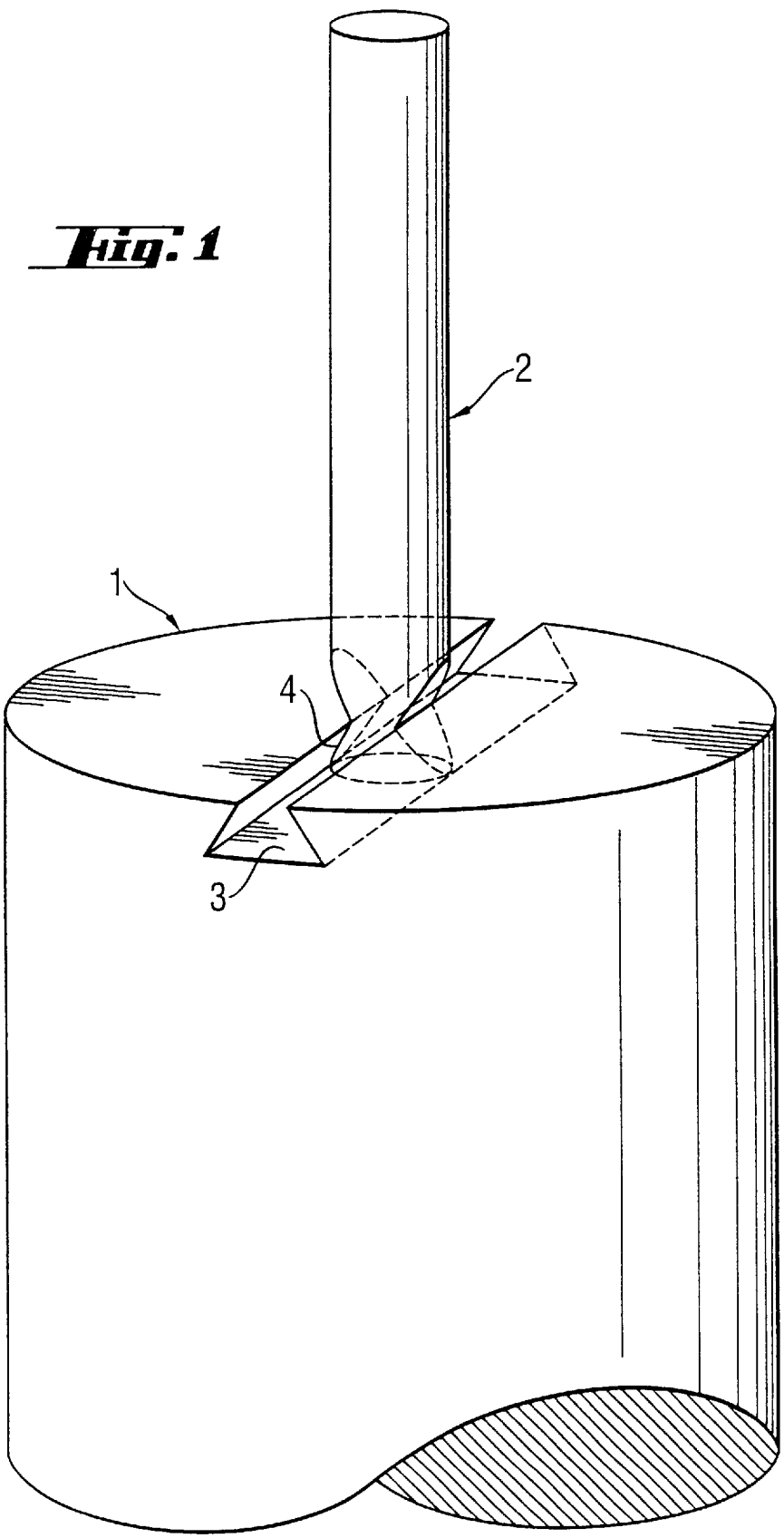
FIG. 1 shows the holding arrangement of the invention in which a polycrystalline silicon rod with a groove is suspended from a monocrystalline rod with a conical shoulder.

To create the connection between the monosilicon rod 2 and polysilicon rod 1, tongue 10 and groove 3 are pushed into one another. The monocrystalline rod should preferably be pushed in as far as the center axis X of the polysilicon rod 1. The polysilicon rod is lowered and is held securely by means of the surface pressure between tongue 10 and groove 3 (FIG. 1). Thus FIG. 1 shows the holding arrangement of the invention in which the polycrystalline rod 1 with a grove 3 is suspended from the monocrystalline rod 2 with the conical shoulder 4.

Accordingly, the holding system according to the invention corresponds to a mechanical connection between a monocrystalline holding rod and a polycrystalline silicon rod which can be obtained without using thermal manufacturing steps and other connecting materials. This is preferably used as charging material for charging or recharging a melting crucible during the production of semiconductor materials.

Accordingly, while a few embodiments of the present invention have been shown and described, it is to be understood that many changes and modifications may be made thereunto without departing from the spirit and scope of the invention as defined in the appended claims.

What is claimed is:

1. A charging material made from semiconductor material, for charging or recharging a melting crucible during the Czochralski crucible-pulling process, comprising
   a polycrystalline semiconductor rod, which at one end has a groove; and
   a monocrystalline semiconductor rod, which at one: end has a tongue; and
   a tongue-and-groove connection being created when said rods are coupled to each other.

2. The charging material as claimed in claim 1, wherein the monocrystalline semiconductor rod is a seed crystal.

3. A holding system for holding a polycrystalline silicon rod during the Czochralski crucible-pulling process or the float zone process, comprising
   a tongue-and-groove connection between the polycrystalline semiconductor rod, which at one end has a groove, and a monocrystalline semiconductor rod, which at one end has a tongue; and
   said connection being created when said tongue is coupled in to said groove.

4. The holding system as claimed in claim 3, wherein the monocrystalline semiconductor rod is a seed crystal.

* * * * *